United States Patent [19]

Swartling

[11] Patent Number: 4,634,025
[45] Date of Patent: Jan. 6, 1987

[54] HOPPER MOUNTING ARRANGEMENT FOR AN AUTOMATIC TONING APPARATUS

[75] Inventor: Lennart G. Swartling, Newark, Del.

[73] Assignee: E. I. Du Pont de Nemours and Company, Wilmington, Del.

[21] Appl. No.: 777,454

[22] Filed: Sep. 18, 1985

Related U.S. Application Data

[63] Continuation-in-part of Ser. No. 559,796, Dec. 9, 1983, abandoned.

[51] Int. Cl.$^4$ .............................................. B67D 5/64
[52] U.S. Cl. .................................. 222/161; 222/198; 222/DIG. 1; 118/653; 366/240
[58] Field of Search ............... 222/160, 161, 198, 199, 222/200, 196, DIG. 1; 118/653, 308, 656; 198/533; 366/240, 332, 212; 414/525 A

[56] References Cited

U.S. PATENT DOCUMENTS

| | | |
|---|---|---|
| 992,134 | 5/1911 | Kelly ..................................... 74/592 |
| 1,803,521 | 5/1931 | Bergerioux .......................... 222/200 |
| 2,239,409 | 4/1941 | Woodruff et al. ...................... 91/37 |
| 2,500,293 | 3/1950 | O'Connor ................... 414/525 A X |
| 2,689,597 | 9/1954 | Kinnear .......................... 118/308 X |
| 3,055,338 | 9/1962 | Herzhoff et al. .................... 118/120 |
| 3,212,624 | 10/1965 | Hess ...................................... 198/64 |
| 3,232,492 | 2/1966 | Carrier, Jr. .......................... 222/161 |
| 3,257,040 | 6/1966 | Dumbaugh et al. ................ 222/161 |
| 3,552,545 | 1/1971 | Hartman ............................ 198/533 |
| 3,627,277 | 12/1971 | Amori ................................. 366/240 |
| 4,069,791 | 1/1978 | Tobias ................................. 118/120 |
| 4,144,061 | 3/1979 | Bean ............................... 118/653 X |
| 4,561,759 | 12/1985 | Knott ............................... 222/200 X |

Primary Examiner—Joseph J. Rolla
Assistant Examiner—Nils E. Pedersen

[57] ABSTRACT

A mounting and drive arrangement for a hopper of an automatic toning apparatus includes mounting members mounted at each lateral end of one reciprocably mounted portion of the hopper. The mounting members are stiff in a plane normal to the path of transport of the photo-element through the toning apparatus.

45 Claims, 17 Drawing Figures

HOPPER MOUNTING ARRANGEMENT FOR AN AUTOMATIC TONING APPARATUS

CROSS REFERENCE TO RELATED APPLICATIONS

This application is a continuation-in-part application of pending U.S. Ser. No. 559,796, filed Dec. 9, 1983 now abandoned.

BACKGROUND OF THE INVENTION

1. Field of the Invention

This invention pertains to an automatic toning apparatus of the type having a reciprocating hopper and, in particular, to a mounting arrangement for the reciprocating hopper.

2. Description of the Prior Art

Apparatus which automatically dispenses particulate toner material onto the imagewise tacky surface of a photo-element is known. Exemplary of such apparatus is that disclosed in U.S. Pat. No. 4,069,791 (Tobias), assigned to the assignee of the present invention. In the Tobias patent an exposed photo-element having an imagewise tacky surface thereon is conveyed in a predetermined direction beneath a hopper having particulate toning material therein. The toner is dispensed from the hopper as the photo-element is transported therebeneath. One wall of the hopper is fixed while the other wall thereof is reciprocated in a direction transversely to the movement of the photo-element. The transverse reciprocation of the one wall of the hopper causes particulate toner to fall from the hopper onto the surface of the photo-element. The reciprocating wall of the hopper also carries a brush pad which moves therewith. The transverse reciprocating movement of the pad embeds particulate toner dispensed from the hopper into the surface of the photo-element passing therebeneath.

Presently such a toning apparatus is driven by a barrel cam assembly and utilizes a dove-tail linear bearing arrangement which facilitates the transfer of reciprocating lateral oscillatory energy to the one wall of the hopper. Use of a linear bearing presupposes close operating tolerances which, as in the case of any mutually abrading surfaces, have a tendency to change as the bearing wears. Since the reciprocating wall of the hopper is mounted to one element of the bearing, wear in the bearing has the tendency of altering the clearance distance by which the hopper is spaced above the path of transport of the photo-element. A barrel cam by its nature generates vibratory forces and, as such, may be objectionably noisy in some environments. Such forces also tend to increase as the cam wears, thus necessitating a rather massive frame in order to absorb the vibratory energy. Further, a barrel cam has built-in backlash which increases as it is used. As a result of the use of both a dove-tailed bearing and a barrel cam drive, the vibratory frequency at which the hopper oscillates is limited.

In view of the foregoing it is believed advantageous to provide a mounting arrangement for the hopper of an automatic toning apparatus which eliminates the use of close tolerance linear bearings and thereby eliminates the possibility of bearing wear and of the alteration of the clearance space between the toning pad and the surface of the photo-element. Elimination of the close tolerances would provide, as an attendant advantage, ease of manufacture, assembly and maintenance. It is also believed to be advantageous to provide a mounting arrangement for the hopper which minimizes friction and wear and reduces weight, thereby minimizing noise. Further, it is believed advantageous to provide a drive arrangement for the hopper which avoids the backlash and vibration attendant with the use of the barrel cam drive mechanism. As a corollary, since vibration is minimized, the weight and size requirements of the frame is also commensurately lessened. Still further, constraints on hopper vibratory frequency are also reduced.

SUMMARY OF THE INVENTION

The present invention relates to an apparatus for applying particulate material to an element as that element is transported along a planar path transport. The apparatus generally includes a frame and a hopper having a first and a second portion. In all embodiments of the invention one of the portions of the hopper is reciprocable with respect to the frame.

In all of the embodiments a first pair of flexible mounting members is provided for mounting the reciprocable portion of the hopper to the frame. One of the first pair of flexible members is disposed at each end of the reciprocable portion of the hopper. Each such flexible member is stiff in a plane normal to the path of transport of the photo-element to thereby rigidly support the reciprocable portion of the hopper a predetermined clearance distance above the path of transport. The provision of such a first pair of flexible mounting members minimizes noise of operation and eliminates the requirements for close clearances that occur with abrading linear bearings. In addition, since the mounting member is stiff in the normal plane the clearance distance between the underside of the hopper and the path of transport of the photo-element remains substantially constant.

Each embodiment of the invention further includes a reciprocable counterweight mounted in a position and operable to counterbalance the reciprocable motion of the hopper. In one embodiment the counterweight is defined by a toning pad disposed downstream of the hopper in the direction of transport of the element. The bristles of the toning pad support the pad on the path of transport. Guides are provided to guide the reciprocable motion of the pad. In other embodiments of the invention the counterweight is defined by either a member separate from the hopper or by the other portion of the hopper. In both of these instances a second pair of flexible members is provided for mounting the counterweight to the frame in a position wherein the counterweight lies close to the center of gravity of the hopper. In each embodiment the flexible mounting members each comprise a leaf spring mounted at each lateral end of the counterweight. The counterweight is arranged to reciprocate in opposed phase relationship with respect to the reciprocable portion of the hopper. It is appreciated that in the embodiment in which a second reciprocable portion of the hopper serves as the counterweight, the need for a separate member serving as the counterweight is eliminated.

An actuator is connected to the reciprocable portion of the hopper and to the counterweight (however realized) to reciprocate each of them in the opposed phase relationship, preferably 180°. The actuator has a rotatable shaft the axis of which is, in the preferred case, substantially parallel to the path of transport of the photo-element and simultaneously perpendicular to the motion of the hopper. The actuator is, in the preferred form, connected to each of the reciprocable portion of the hopper and to the counterweight by an eccentric bearing mounted in angularly opposed relationship on the shaft. Each eccentric bearing is connected to either the moveable portion of the hopper or to the counterweight, as the case may be, by a connecting rod. Alternatively, a crank arrangement may be used. In the most preferred configuration the actuator is disposed centrally above the hopper, while in an alternate configuration the actuator is disposed at one side of the hopper.

BRIEF DESCRIPTION OF THE DRAWINGS

The invention will be more fully understood from the following detailed description thereof taken in connection with the accompanying drawings which form a part of this application and in which.

DETAILED DESCRIPTION OF THE INVENTION

Throughout the following detailed description similar reference numerals refer to similar elements in all figures of the drawings.

Figures 1, 2:
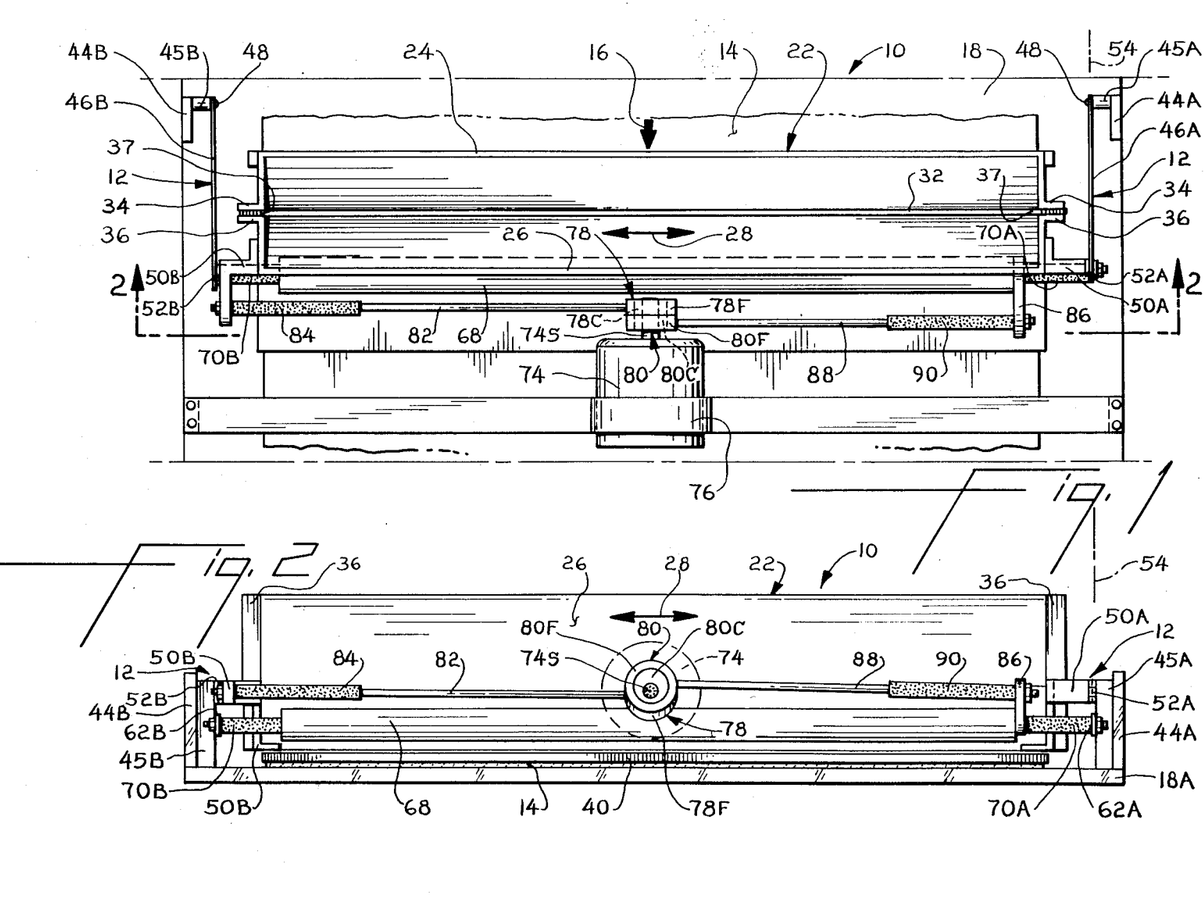
FIG. 1 is a plan view of an embodiment of a toning apparatus having a mounting and drive arrangement in accordance with the present invention in which one portion of the toner hopper is reciprocable, a separate counterweight is provided and the actuator is centrally mounted.
FIG. 2 is a front elevational view of the toning apparatus shown in FIG. 1.

With reference to FIGS. 1 and 2 shown in plan and front elevation, respectively, is a first embodiment of a toning apparatus generally indicated by reference character 10 having a mounting and drive arrangement generally indicated by reference character 12 in accordance with the present invention.

The toning apparatus 10 is adapted to apply a particulate material, such as toner, to an element 14, such as a photo-element, as that element 14 is transported along a planar path of transport in the direction of the arrow 16 through the apparatus 10. The apparatus 10 includes a stationary frame 18 the rearward (in the path of travel 16) portion 20 (FIG. 3) of which serves as a toning table for purposes discussed in more detail herein.

The frame 18 carries a hopper 22 for particulate material 23, such as toner, which includes a first, forward, portion 24 and a second, rearward, portion 26. In accordance with the embodiment of the invention shown in detail in FIGS. 1 through 6 one of the portions 24 or 26 is stationary and the other reciprocable with respect to the frame 18 in the direction of arrows 28. In the embodiment shown in FIGS. 14 through 17 one of the portions of the hopper 22 (in the illustrated instance, the forward portion 24) is reciprocable with respect to the frame in the direction of arrows 28. In the other embodiment described in detail in connection with FIGS. 10 through 13, both portions 24 and 26 of the hopper 22 are moveable in the directions of arrows 28.

As shown in FIGS. 1 through 6, in the first embodiment the first portion 24 is the stationary portion of the hopper 22. Of course it is to be understood that rearward portion 26 of the hopper 22 may be fixed with respect to the frame and the forward portion 24 made reciprocable and remain within the contemplation of the first embodiment of the present invention. The stationary portion 24 of the hopper 22 is fixedly secured to the frame 18 by any suitable means of attachment. The moveable portion 26 of the hopper 22 is mounted for transversely or laterally reciprocating movement in the direction of the arrows 28. This lateral movement of the reciprocable portion of the hopper 26 is facilitated by the mounting and drive arrangement 12 in accordance with the present invention.

Figures 3, 4:
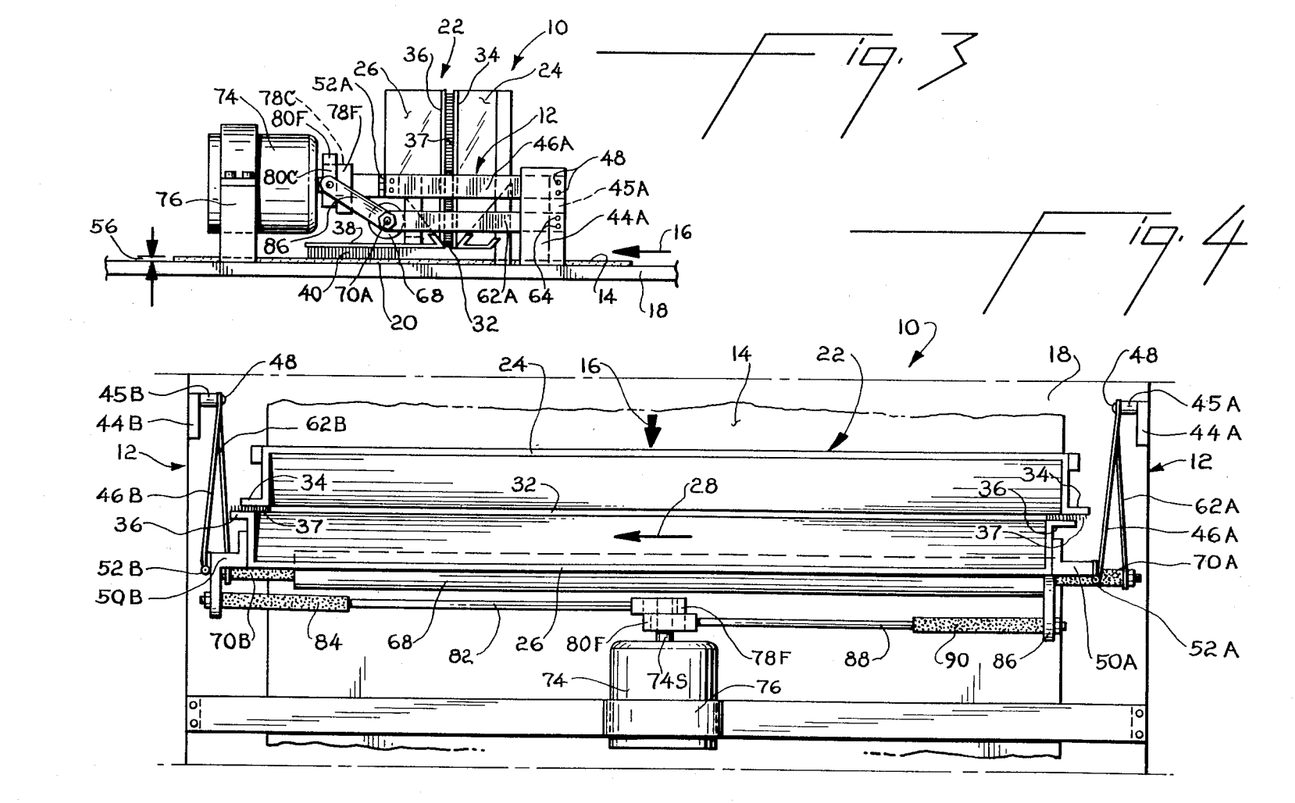
FIG. 3 is a side elevational view of the toning apparatus shown in FIG. 1.
FIG. 4 is a plan view similar to FIG. 1 showing the various members of the mounting and drive arrangement at the full extent of their opposed phase relationship.

The stationary and reciprocable portions of the hopper cooperate to define a hopper throat 32 (FIGS. 1 and 3) which communicates with the path of transport 16. Each of the stationary portion 24 and reciprocable portion 26 have laterally outward projecting flanges 34, 36 respectively, which are coated or provided with a mohair lining 37 to permit relative motion between the portions 24 and 26 and yet at the same time prevent escape of particulate toner material except through the throat 32. As seen in FIG. 3 the reciprocable portion 26 of the hopper carries a rearwardly projecting planar element 38 from the underside of which depends a mohair toning brush, or pad, 40. The toning brush 40, being affixed to the moveable portion 26 of the hopper 22, oscillates laterally therewith in the direction of the arrows 28 to embed the toner dispensed onto the photo-element 14 into the surface thereof.

The mounting and drive arrangement 12 in accordance with the present invention includes upstanding posts 44A and 44B secured to the frame 18 adjacent on each respective lateral end of the hopper 22. Each post 44A, 44B is provided with a spacer 45A and 45B, respectively. One member 46A, 46B of a first pair 46 of flexible mounting members is respectively secured to an associated post 44A, 44B by any suitable means of attachment, such as screws 48. The other end of each of the flexible members 46 is respectively secured to connecting pieces 50A, 50B, by pivotal attachments 52A, 52B. The connecting pieces 50A and 50B are secured at each lateral end of the reciprocable portion 26 of the hopper 22. Each flexible member 46, which in the preferred case takes the form of a leaf spring element, is stiff in a plane 54 that extends normal to the planar path of transport of the photo-element 14. Thus, each of the first pair 46 of mounting members rigidly supports the reciprocable portion 26 of the hopper 22 at a predetermined clearance distance 56 (FIG. 3) above the path of transport of the photo-element 14.

One member 62A, 62B of a second pair 62 of flexible mouting members similar to the members 46 is respectively secured to an associated one of the posts 44A, 44B by suitable means of attachment, such as screws 64. The other ends of each of the flexible mounting members 62 are secured to a counterweight 68 through flexible couplings 70A, 70B. The counterweight 68 is arranged to lie close to the center of gravity of the moveable portion 26 of the hopper 22. As shown in the Figures, the flexible members 46 are mounted vertically above the flexible members 62. However, any suitable arrangement may be used to mount the members 46 and 62 to the frame 18 and remain within the contemplation of the present invention.

An actuator 74 in the form of an electric motor is mounted by a bracket 76 in a configuration in which it lies centrally and axially above the hopper 22. The shaft 74S of the actuator 74 preferably extends parallel to the direction of transport 16 of the photo-element 14 and perpendicular to the motion of the hopper. Alternatively, of course, the actuator 74 may be mounted with its shaft vertical, i.e., perpendicular to the plane of the photo-element 14. First and second cams 78C and 80C respectively are suitably affixed to the shaft 74S. Followers 78F and 80F are respectively associated with the cams 78C and 80C. The cam follower 78F is linked to a projecting portion of the connecting piece 50B by a stiff, light linkage rod 82 and a flexible coupling 84. Similarly, the follower 80F is linked to an ear 86 extending from one end of the counterweight 68 by a similar linkage rod 88 and a flexible coupling 90. The cams 78C and 80C are secured to the shaft 74S in opposed phase relationship. Preferably, the cams 78C and 80C are 180° out of phase. The cams and followers may be most preferably realized by use of a ball bearing arrangement in which the inner race of the bearing serves as the cam while the outer bearing race is the follower.

In operation, rotation of the shaft 74S transmits motive force to each of the moveable portion 26 of the hopper 22 and to the counterweight 68 to thereby reciprocate the same in opposed phase relationship laterally of the path of transport 16 (FIG. 4). In this manner the hopper portion 26 may be reciprocated with respect to the stationary portion 24 thereof.

The actuator 74 may be disposed in an alternate configuration shown in FIGS. 5 through 8 in which the actuator 74 is disposed laterally of the hopper 22. Preferably the shaft 74S is again parallel to the direction of transport 16 of the photo-element 14 and perpendicular to the direction 28 of reciprocation of the hopper 22. However, the shaft 74S may be oriented in any angular orient in a plane perpendicular to the direction of oscillation 28. In this embodiment, the reciprocable portion 26 of the hopper 22 is provided with an extending tab 92 while the counterweight is provided with a similar tab 94. The linkage rods 82 and 88 are respectively connected to the tabs 92, 94.

Figures 7, 8, 9, 11:
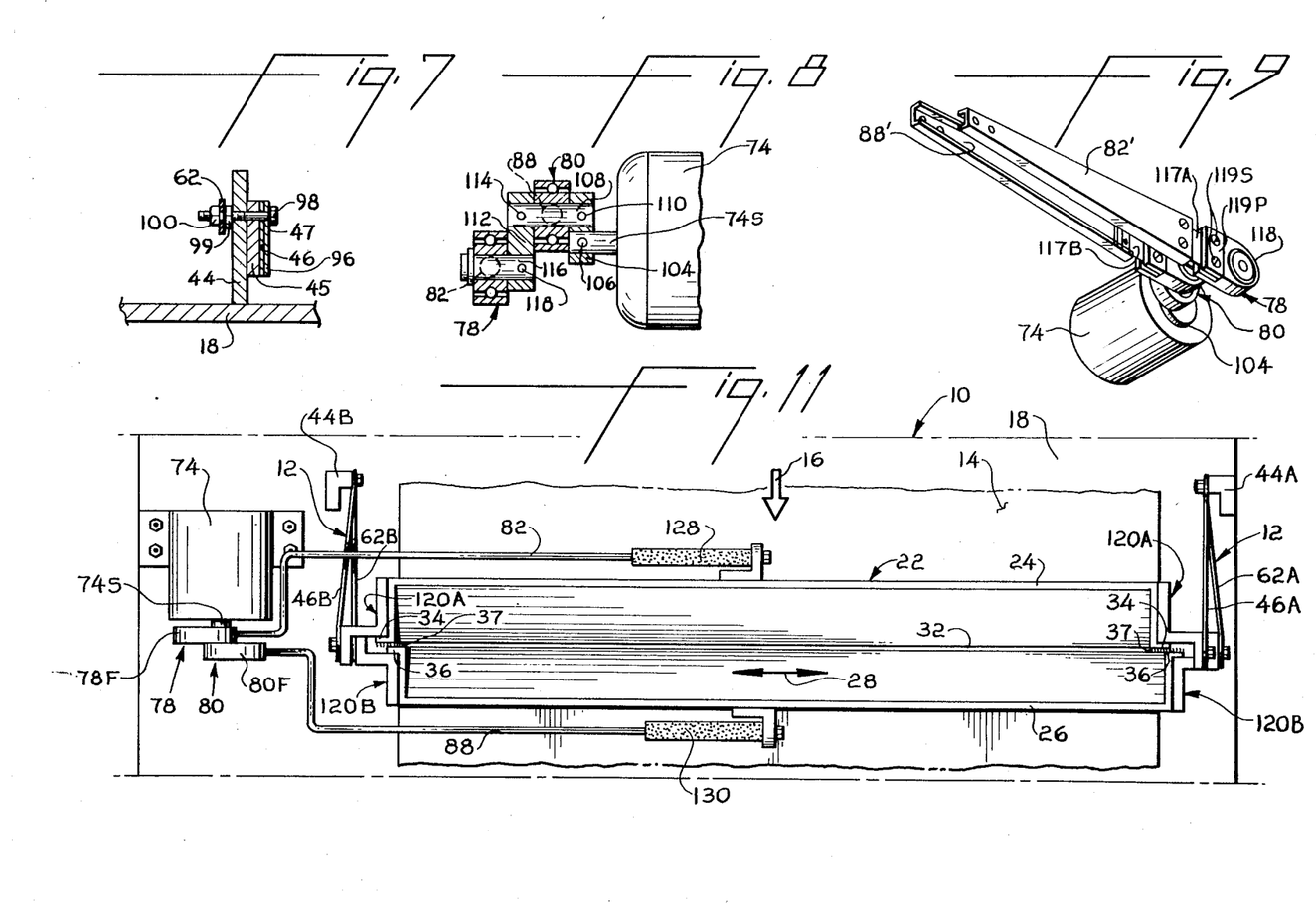
FIG. 7 is a sectional view of the mounting arrangement taken along section lines 7—7 in FIG. 5 showing an alternate configuration for mounting the flexible mounting members.
FIG. 8 is a view taken along section lines 8—8 in FIG. 6 of a cam and follower arrangement used to connect the side mounted actuator configuration shown in FIGS. 5 and 6 with the reciprocable portion of the hopper and the counterweight.
FIG. 9 is a perspective view of a crank arrangement used to connect the actuator to the reciprocable portion of the hopper and the counterweight.
FIG. 11 is a plan view of the embodiment of FIG. 10 in which the actuator is in a side-mounted configuration.

FIG. 7 illustrates an alternate manner in which the flexible members 46, 62 may be mounted in accordance with any embodiment of the present invention disclosed in this application. In this instance, the flexible members 46, 62 are mounted on opposite sides of the post 44. The spacer 45 is disposed between the post 44 and the flexible member 46 associated with the hopper 22. As seen in this FIG. 7, the flexible member 46 may be provided with an aperture 47 which facilitates vertical adjustment of the flexible member 46 in a direction parallel to the plane 54. A brace bar 96 cooperates with the spacer 45 to sandwich the flexible member 46 to prevent buckling of the same. The entire structure is secured into the assembled relationship shown in FIG. 7 by a through-bolt 98 with associated nuts 99. The flexible member 62 is secured to the opposite side of the post 44 on the bolt 98 by an additional lock nut 100.

FIGS. 8 and 9 illustrate alternate arrangements whereby the actuator 74 may be operatively connected to the reciprocable portion of the hopper and the counterweight. In FIG. 8, the shaft 74S has a first crank arm 104 suitably affixed thereto, as by a pin 106. A stub shaft 108 is pinned, as at 110, to the arm 104. The outboard end of the stub shaft 108 carries a second crank arm 112 suitably secured by a pin 114. The second arm 112 itself receives a second stub shaft 116 which is secured by a pin 118. The cam and follower arrangements 78 and 80 are respectively attached to the shafts 116 and 108. The linkage rods 82 and 88 are connected to the cam and followers 78 and 80, respectively, implemented by the ball bearings as discussed earlier. In FIG. 9, connecting rods 82' and 88' serve the function of the linkages between the actuator 74 and the reciprocable portion of the hopper and the counterweight, respectively. The rods 82', 88' are flexibly coupled via springs 117A and 117B, respectively to housings 118 of the cam and followers 78, 80, respectively. The springs 117 are secured to opposed ends to the rods and to the cams and followers, as the case may be by plates 119P and screws 119S.

Figures 10, 12, 13:
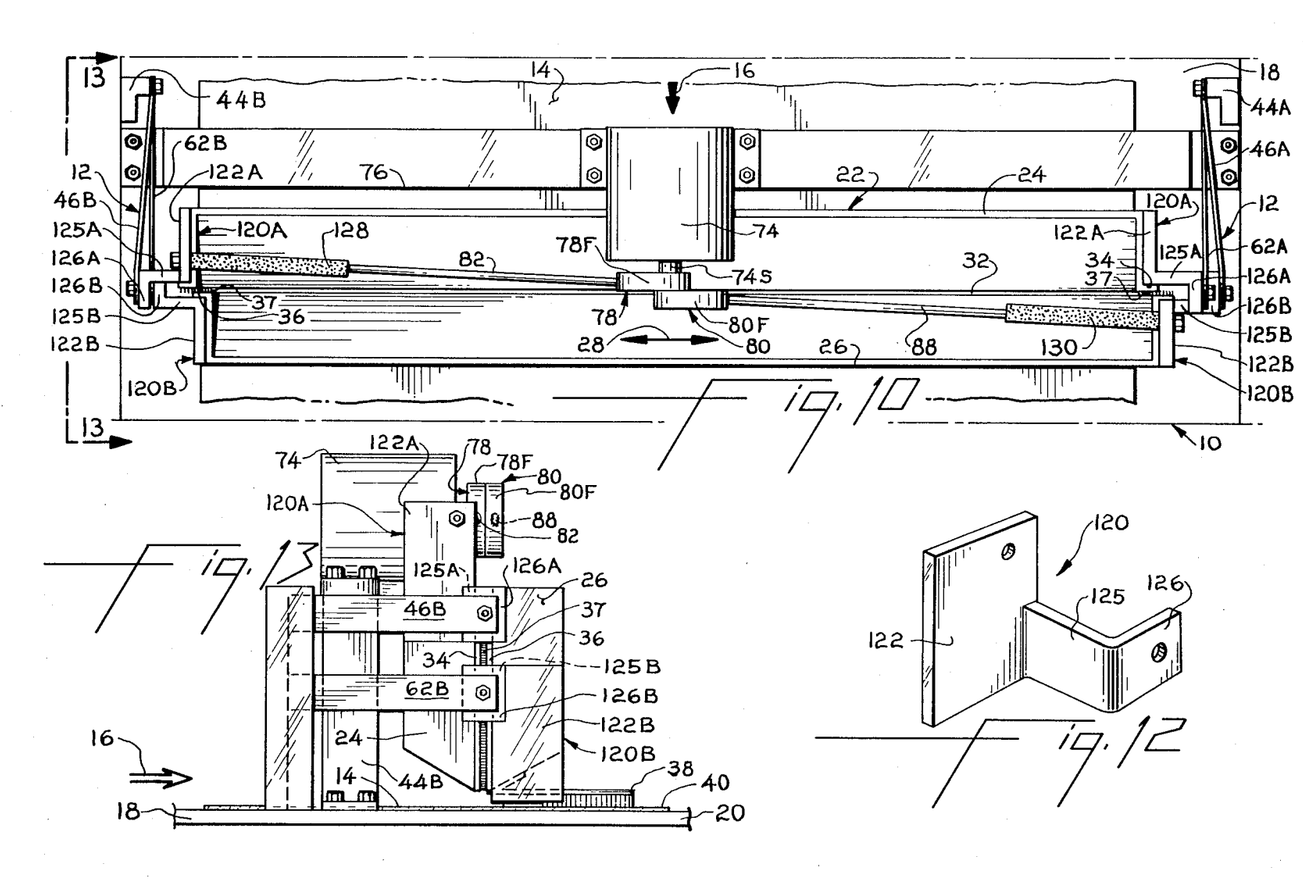
FIG. 10 is a plan view of another embodiment of a toning apparatus having a mounting and drive arrangement in accordance with the present invention in which both portions of the hopper are reciprocable and one of the hopper portions serves as the counterweight and in which the actuator is centrally mounted.
FIG. 12 is an isolated perspective view of a mounting bracket used in the embodiment of the invention shown in FIGS. 10 and 11.
FIG. 13 is a side elevation view taken along view lines 13—13 in FIG. 10 illustrating the mounting of the flexible mounting members in the embodiment of the invention shown in FIGS. 10 and 11.

In accordance with another embodiment of the invention both the forward portion 24 and the rearward portion 26 of the hopper 22 are reciprocably mounted with respect to the frame 18. In this embodiment each portion of the hopper 22 serves a counterweight to the other, thus eliminating the necessity for a separate counterweight member 68 used in the embodiment discussed earlier. In this embodiment of the invention each lateral end of each portion of the hopper 22 carries a bracket 120 shown in perspective in FIG. 12. The bracket 120 is an integrally formed member having a planar base portion 122 from which projects a first leg 125 and a second leg 126. The bracket 120 is arranged for interchangeable mountability to appropriately support each of the reciprocable portions 24, 26 from the frame. In FIGS. 10, 11 and 13, brackets indicated by character "A" are connected to the forward portion of the hopper while bracket "B" is connected to the rear hopper portion. The flexible mounting members 46 rigidly support the forward portion 24 while the flexible mounting members 62, which supported the separate counterweight member 68 in the first embodiment, are used to rigidly support the rearward portion 26. As seen from FIG. 13, the flexible mounting members 46 lie above the flexible mounting members 62.

In the center-mount actuator configuration shown in FIG. 10 linkage rods 82 and 88 are arranged, via resilient couplings 128, 130, to connect the forward and rearward reciprocably mounted hopper portions 24 and 26, respectively, in the opposed phase relationship previously described in connection with FIGS. 1 through 6. Of course, in this embodiment of the invention, the opposed motions of each of the reciprocably mounted hopper portions 24, 26 serve as the counterweight to the other. The center of gravity of the hopper portions are made to lie as close as practicable to each other. FIG. 11 illustrates a side mount actuator configuration for this embodiment of the invention.

FIGS. 14 through 17 illustrate another alternate embodiment of the invention. In this embodiment the forward portion 24 of the hopper 22 is fixed with respect to the frame 18. The forward portion of the hopper has a brush pad 24P to guide the element 24 and prevent it from snagging. The rear portion 26 is reciprocably mounted to the springs 46 via the pivots 52A, 52B and the connecting pieces 50A, 50B. The springs 46A, 46B support the hopper portion 26 the predetermined distance 56 (FIG. 16) above the path of transport 16 in a manner similar to that earlier discussed.

In this embodiment of the invention the toning pad is split to form a forward and rearward pad indicated by the characters 40F and 40R, respectively. The rearward portion 40R of the pad 40 is supported by its bristles above the path of transport. At each lateral end of the pad 40R there is provided an outwardly extending guide bar 136. Guide blocks 138 are disposed on the frame 18. The bars 136 project through their associated blocks 138 whereby the transverse motion of the rearward pad 40R may be effectively guided.

Figure 14:
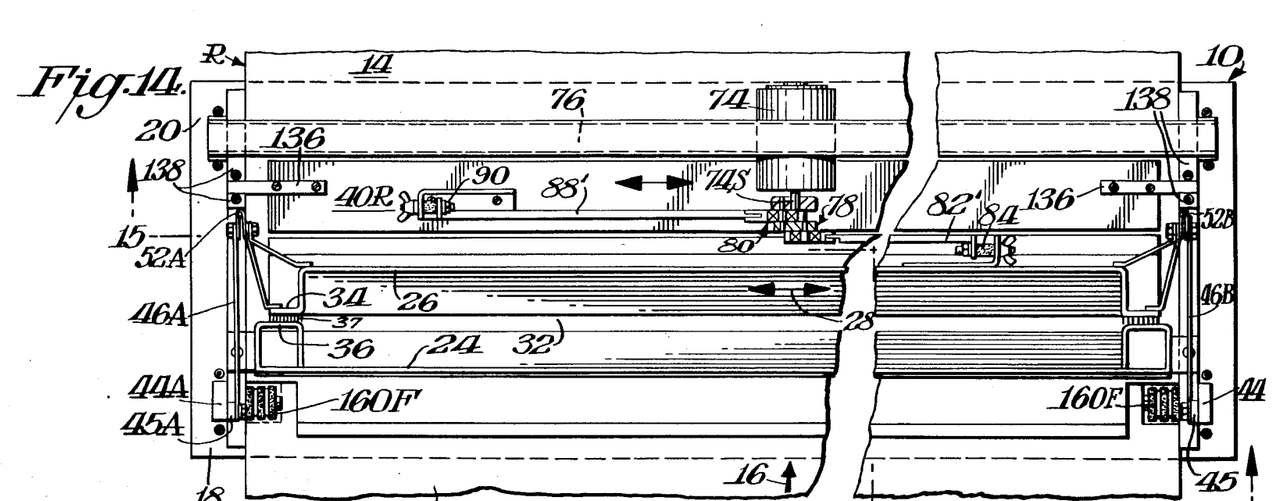
FIG. 14 is a plan view of another embodiment of a toning apparatus having a mounting and drive arrangement in accordance with the present invention in which one portion of the hopper is reciprocably mounted to the frame and a toning pad serves as the counterweight and the actuator is centrally mounted.
Figure 15:
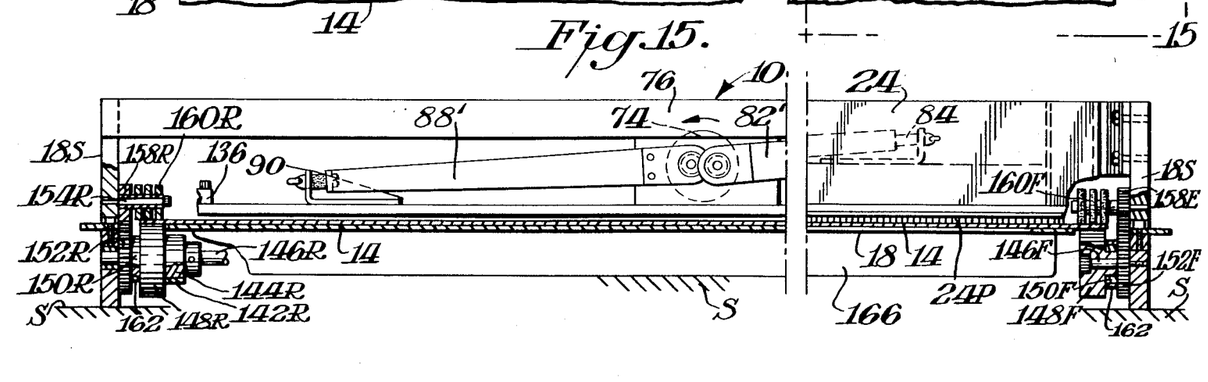
FIGS. 15 and 16 are elevation views taken along view lines 15—15 and view lines 16—16 in FIG. 14, respectively; and, FIG. 17 is a plan view similar to FIG. 14 showing the various members of the mounting and drive arrangement at the full extent of their opposed phase relationship.
Figure 16:
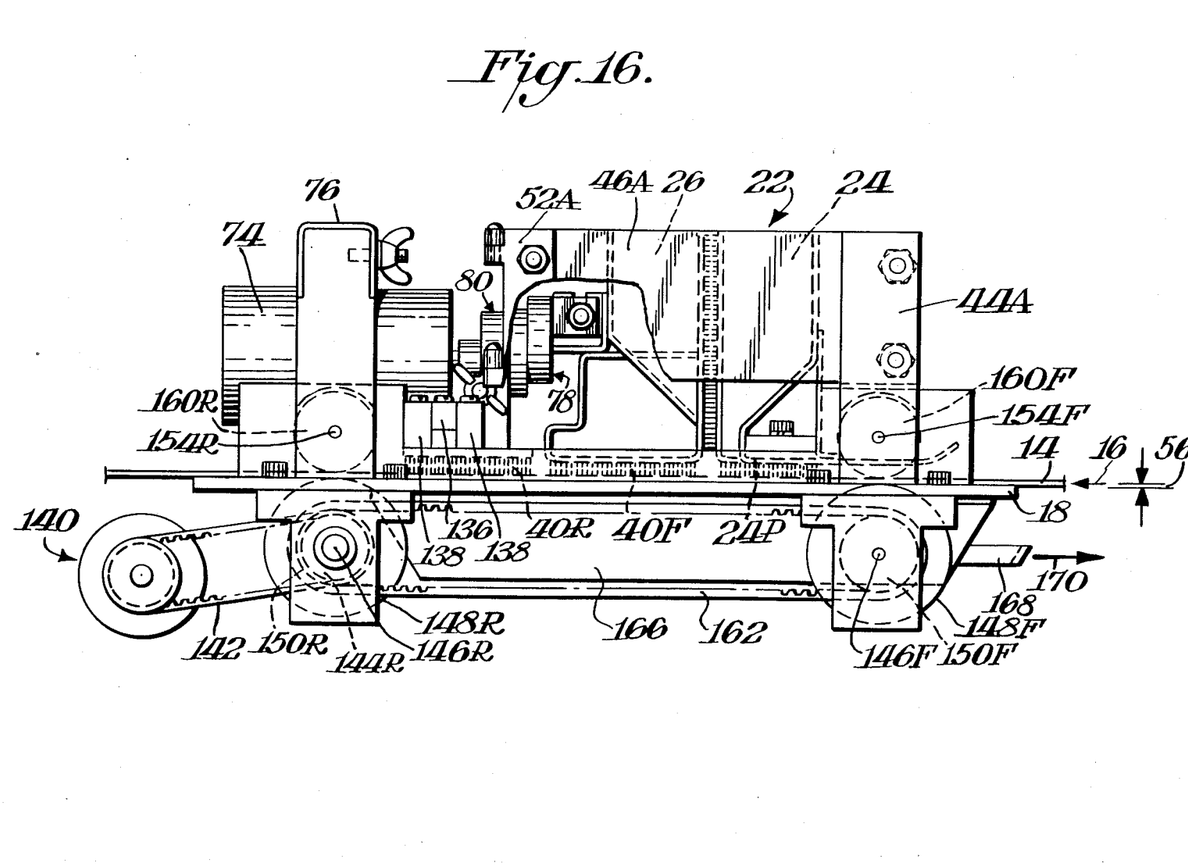

The reciprocable portion 26 of the hopper 22 and the rearward pad 40R are connected to the actuator 74 via a linkages 82' and 88', respectively (as described in connection with FIG. 9). The actuator 74 thereby generates opposed phase relational movement of the hopper portion 26 and the rearward pad 40R similar to the motions discussed in connection with the other embodiments.

From the foregoing it may be appreciated that herein provided is an efficient mounting and driving arrangement which facilitates reciprocating motion of a reciprocable portion or portions, as the case may be, of the hopper 22 and does so in a manner which exhibits minimal noise and vibration. Accordingly, it is to be appreciated that the use of the mounting and drive arrangement hereinabove described utilizes lighter interconnecting parts. This permits the realization of a lighter weight tabletop model of an automatic toning machine which may be driven at increased operating (reciprocating) frequencies.

Since the reciprocable portion or portions of the hopper is or are mounted and maintained in a predetermined distance 56 above the path of transport by the flexible mounting members, and since these flexible mounting members (leaf springs) are relatively stiff in the direction normal to that path of transport, the wearing and clearances which change as linear bearings or other wearing members does not occur. Thus, ease of manufacture, lower cost and ease of maintenance are attendant advantages with the construction hereinabove described.

It should also be appreciated that whether or not a separate counterweight member is used, the flexible members may be secured to the hopper portions and the frame by any of the expedients disclosed herein or any equivalents thereto. Moreover, either embodiment of the invention may utilize any of the expedients described to interconnect the actuator (whether center or side mounted) with the reciprocable portion of the hopper and the counterweight, (however realized).

Figure 17:
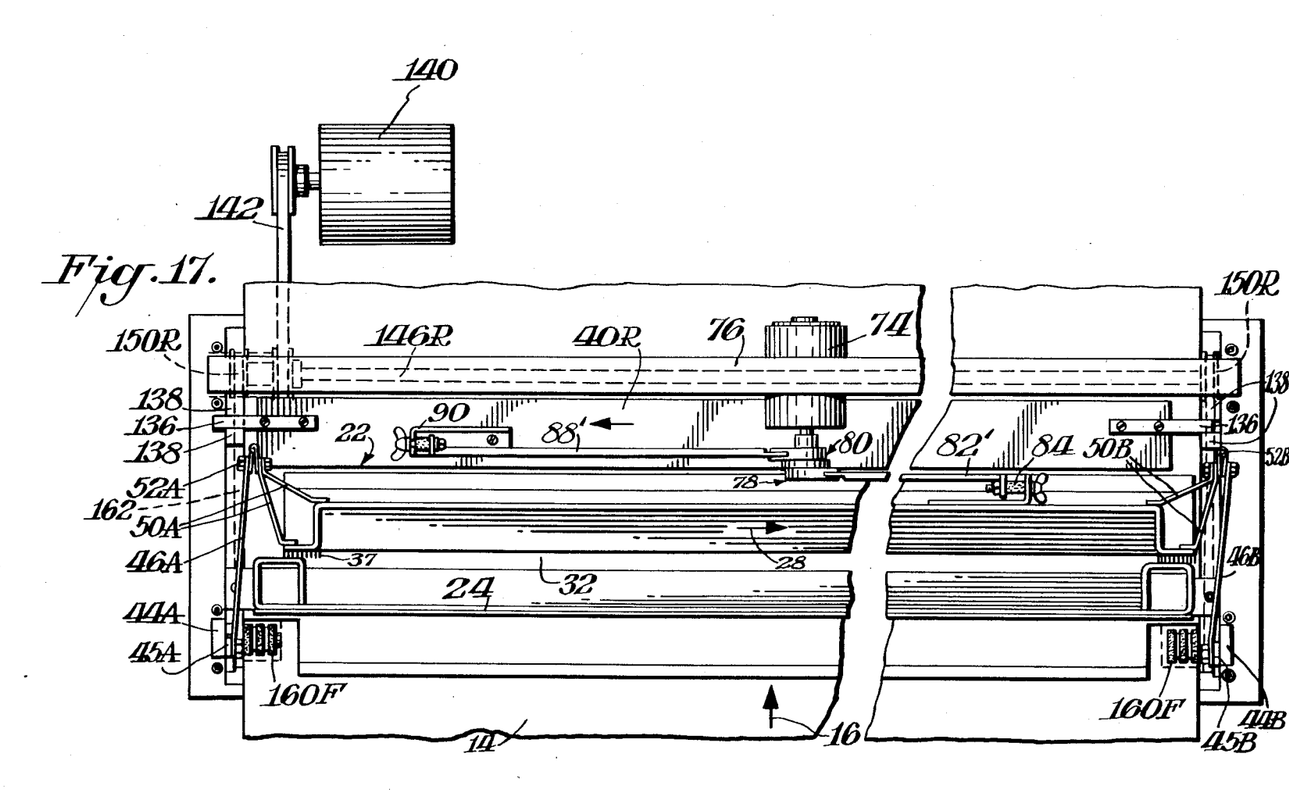

In the embodiment shown in FIGS. 14 through 17 a drive motor schematically indicated at 140 is suitably and conveniently mounted to the frame 18. The motor 140 is connected, as by a cog belt 142 or a gear, to a timing pulley 144R or a gear, respectively. The pulley 144R (or gear) is connected to a shaft 146R which is journaled in a sideplate 18S which is part of the frame 18. The sideplate 18S extends downwardly a sufficient distance to define legs which support the apparatus 10 on a support surface S, e.g., a table or machine casing. The shaft 146R extends transversely beneath the frame 18 (FIG. 17). The shaft 146R carries, at each end, a lower drive roller 148R. Mounted outwardly of each drive roller 148R at each end of the shaft 146R is a timing pulley 150R and a gear 152R. A stub shaft 154R is supported in the sideplate 18S at each side of the apparatus 10. A gear 158R mounted on the stub shaft 154R engages the gear 152R. In this manner an upper friction wheel 160R mounted on the shaft 154R moves at the same surface speed as does the lower roller 148R thus forming a nip for advancing the photo-element 16.

Figures 5, 6:
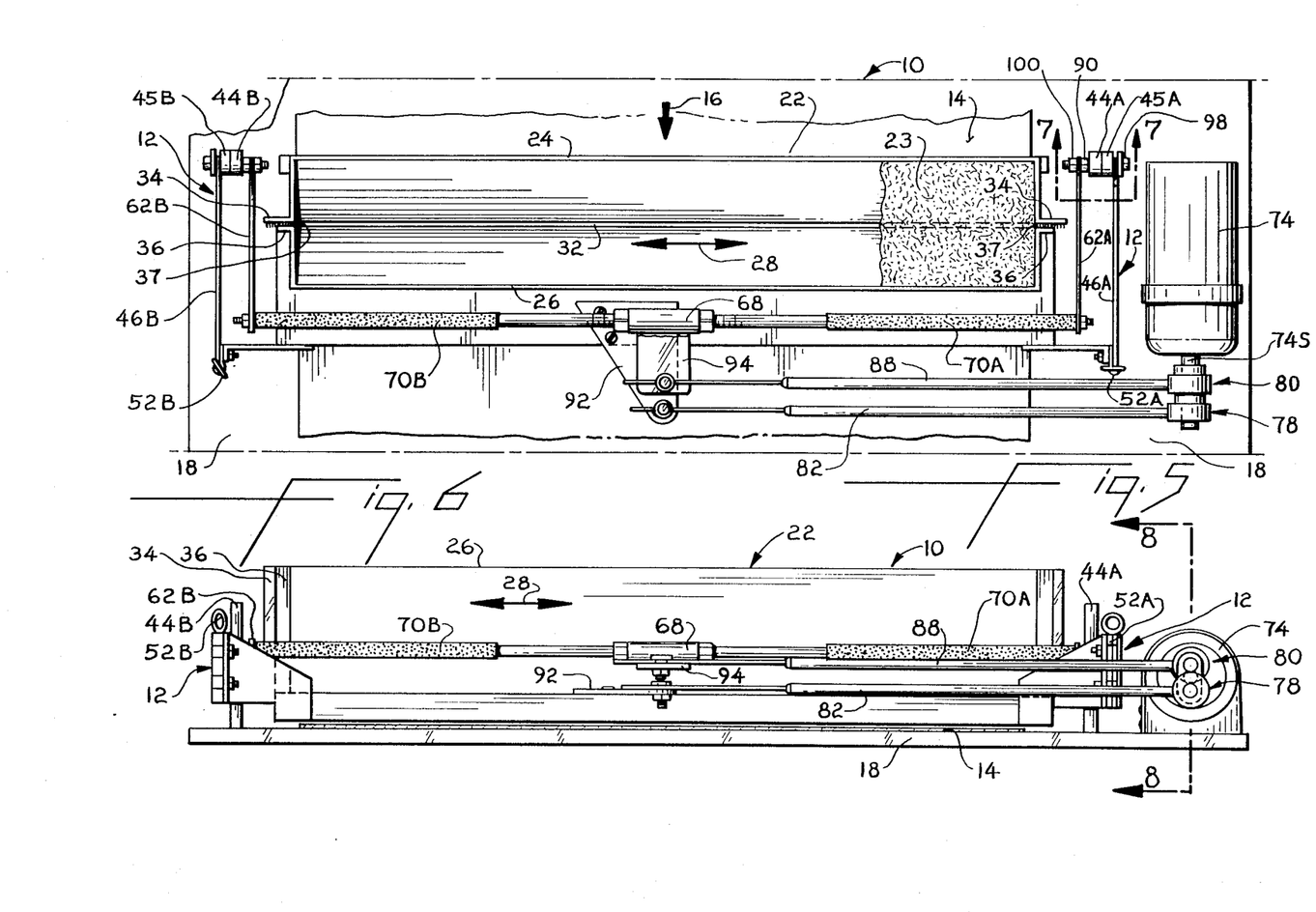
FIGS. 5 and 6 are, respectively, plan and front elevational views respectively similar to FIGS. 1 and 2 showing an alternate actuator configuration in which the actuator is side-mounted on the frame.

The pulley 150R at each end of the shaft 146R is connected by a cog belt 162 (FIG. 16) that runs on each side of the apparatus to a cog pulley 150F (FIG. 6). Each cog pulley 150F is mounted to a lower stub shaft 146F which carries a gear 152F and a lower drive roller 148F. An upper stub shaft 154F carries an upper friction wheel 160F (FIG. 15) and a gear 158F. The gear 158F engages the gear 152F to form a drive arrangement identical to that discussed earlier except that the stub shafts 146F do not extend transversely of the apparatus 10. A tray 166 having a handle 168 thereon is supported beneath the hopper 22 on the surface S. The frame may be perforated in this region so that excess toning material is collected in the tray. The tray 166 is removable in the drive action 170.

Those skilled in the art having benefits of the teachings as hereinabove set forth may effect numerous modifications hereto. These modifications are, however, to be construed as lying within the scope of the present invention as defined in the appended claims.

What is claimed is:

1. Apparatus for applying particulate material to an element as the element is transported along a planar path of transport comprising:
   a frame;
   a hopper having a first and a second portion, one portion being reciprocable with respect to the frame in a direction transverse to the path of transport of the element;

a first pair of flexible mounting members for mounting the reciprocable portion of the hopper to the frame, one of the first pair of flexible members being disposed at each end of the reciprocable portion of the hopper, each flexible member being stiff in a plane normal to the path of transport of the element to thereby rigidly support the reciprocable portion of the hopper a predetermined clearance distance above the path of transport;

a counterweight reciprocably mounted with respect to the frame in a direction transverse to the path of transport of the element;

a second pair of flexible mounting members for mounting the counterweight to the frame in a position wherein the counterweight lies close to the center of gravity of the hopper; and an actuator connected to both the reciprocable portion of the hopper and to the counterweight to reciprocate each of them in opposed phase relationship in a direction transverse to the path of transport of the element.

2. The apparatus of claim 1 wherein the opposed phase relationship between the reciprocable portion of the hopper and the counterweight is 180°.

3. The apparatus of claim 1 wherein each of the first pair and second pair of flexible mounting members is a leaf spring.

4. The apparatus of claim 2 wherein each of the first pair and second pair of flexible mounting members is a leaf spring.

5. The apparatus of claim 1 wherein the actuator has a rotatable shaft the axis of which is substantially parallel to the path of transport of the element and perpendicular to the direction of motion of the reciprocable portion of the hopper, and wherein the actuator is connected to each of the reciprocable portion of the hopper and to the counterweight by a cam and follower mounted in angularly opposed relationship on the shaft, each cam and follower being connected to either the reciprocable portion of the hopper or the counterweight with which it is associated by a connecting rod.

6. The apparatus of claim 2 wherein the actuator has a rotatable shaft the axis of which is substantially parallel to the path of transport of the element and perpendicular to the direction of motion of the reciprocable portion of the hopper, and wherein the actuator is connected to each of the reciprocable portion of the hopper and to the counterweight by a cam and follower mounted in angularly opposed relationship on the shaft, each cam and follower being connected to either the reciprocable portion of the hopper or the counterweight with which it is associated by a connecting rod.

7. The apparatus of claim 3 wherein the actuator has a rotatable shaft the axis of which is substantially parallel to the path of transport of the element and perpendicular to the direction of motion of the reciprocable portion of the hopper, and wherein the actuator is connected to each of the reciprocable portion of the hopper and to the counterweight by a cam and follower mounted in angularly opposed relationship on the shaft, each cam and follower being connected to either the reciprocable portion of the hopper or the counterweight with which it is associated by a connecting rod.

8. The apparatus of claim 4 wherein the actuator has a rotatable shaft the axis of which is substantially parallel to the path of transport of the element and perpendicular to the direction of motion of the reciprocable portion of the hopper, and wherein the actuator is connected to each of the reciprocable portion of the hopper and to the counterweight by a cam and follower mounted in angularly opposed relationship on the shaft, each cam and follower being connected to either the reciprocable portion of the hopper or the counterweight with which it is associated by a connecting rod.

9. The apparatus of claim 3 wherein the actuator is disposed centrally above the hopper.

10. The apparatus of claim 4 wherein the actuator is disposed centrally above the hopper.

11. The apparatus of claim 2 wherein the actuator is disposed at one side of the hopper.

12. The apparatus of claim 3 wherein the actuator is disposed at one side of the hopper.

13. The apparatus of claim 1 wherein the second portion of the hopper is also reciprocable with respect to the frame, the second portion of the hopper being mounted to the second pair of flexible mounting members to serve as the counterweight.

14. The apparatus of claim 13 wherein the opposed phase relationship between the reciprocable portion of the hopper and the counterweight is 180°.

15. The apparatus of claim 13 wherein each of the first pair and second pair of flexible mounting members is a leaf spring.

16. The apparatus of claim 14 wherein each of the first pair and second pair of flexible mounting members is a leaf spring.

17. The apparatus of claim 13 wherein the actuator has a rotatable shaft the axis of which is substantially parallel to the path of transport of the element and perpendicular to the direction of motion of the reciprocable portion of the hopper, and wherein the actuator is connected to each of the reciprocable portion of the hopper and to the counterweight by a cam and follower mounted in angularly opposed relationship on the shaft, each cam and follower being connected to either the reciprocable portion of the hopper or the counterweight with which it is associated by a connecting rod.

18. The apparatus of claim 14 wherein the actuator has a rotatable shaft the axis of which is substantially parallel to the path of transport of the element and perpendicular to the direction of motion of the reciprocable portion of the hopper, and wherein the actuator is connected to each of the reciprocable portion of the hopper and to the counterweight by a cam and follower mounted in angularly opposed relationship on the shaft, each cam and follower being connected to either the reciprocable portion of the hopper or the counterweight with which it is associated by a connecting rod.

19. The apparatus of claim 15 wherein the actuator has a rotatable shaft the axis of which is substantially parallel to the path of transport of the element and perpendicular to the direction of motion of the reciprocable portion of the hopper, and wherein the actuator is connected to each of the reciprocable portion of the hopper and to the counterweight by a cam and follower mounted in angularly opposed relationship on the shaft, each cam and follower being connected to either the reciprocable portion of the hopper or the counterweight with which it is associated by a connecting rod.

20. The apparatus of claim 16 wherein the actuator has a rotatable shaft the axis of which is substantially parallel to the path of transport of the element and perpendicular to the direction of motion of the reciprocable portion of the hopper, and wherein the actuator is connected to each of the reciprocable portion of the hopper and to the counterweight by a cam and follower mounted in angularly opposed relationship on the shaft, each cam and follower being connected to either the reciprocable portion of the hopper or the counterweight with which it is associated by the connecting rod.

21. The apparatus of claim 15 wherein the actuator is disposed centrally above the hopper.

22. The apparatus of claim 16 wherein the actuator is disposed centrally above the hopper.

23. The apparatus of claim 15 wherein the actuator is disposed at one side of the hopper.

24. The apparatus of claim 16 wherein the actuator is disposed at one side of the hopper.

25. Apparatus for applying particulate material to an element as the element is transported along a planar path of transport comprising:
 a frame;
 a hopper having a first and a second portion, one portion being reciprocable with respect to the frame in a direction transverse to the path of transport of the element;
 a first pair of flexible mounting members for mounting the reciprocable portion of the hopper to the frame, one of the first pair of flexible members being disposed at each end of the reciprocable portion of the hopper, each flexible member being stiff in a plane normal to the path of transport of the element to thereby rigidly support the reciprocable portion of the hopper a predetermined clearance distance above the path of transport;
 a counterweight reciprocably mounted with respect to the frame in a direction transverse to the path of transport of the element; and
 an actuator connected to both the reciprocable portion of the hopper and to the counterweight to reciprocate each of them in opposed phase relationship in a direction transverse to the path of transport of the element.

26. The apparatus of claim 25 further comprising:
 a toning pad disposed downstream of the hopper in the direction of transport of the element, the toning pad being mounted with respect to the reciprocable portion of the hopper to serve as the counterweight.

27. The apparatus of claim 25 wherein the second portion of the hopper is also reciprocable with respect to the frame and mounted with respect thereto to serve as the counterweight.

28. The apparatus of claim 25 wherein the opposed phase relationship between the reciprocable portion of the hopper and the counterweight is 180°.

29. The apparatus of claim 27 wherein the opposed phase relationship between the reciprocable portion of the hopper and the second portion of the hopper is 180°.

30. The apparatus of claim 26 wherein the opposed phase relationship between the reciprocable portion of the hopper and the toning pad is 180°.

31. The apparatus of claim 25 wherein each of the first pair of flexible mounting members is a leaf spring.

32. The apparatus of claim 29 wherein each of the first pair of flexible mounting members is a leaf spring.

33. The apparatus of claim 27 wherein each of the first pair of flexible mounting members is a leaf spring.

34. The apparatus of claim 26 wherein each of the first pair of flexible mounting members is a leaf spring.

35. The apparatus of claim 30 wherein each of the first pair of flexible mounting members is a leaf spring.

36. The apparatus of claim 34 wherein the actuator has a rotatable shaft the axis of which is substantially parallel to the path of transport of the element and perpendicular to the direction of motion of the reciprocable portion of the hopper, and wherein the actuator is connected to each of the reciprocable portion of the hopper and to the toning pad.

37. The apparatus of claim 32 wherein the actuator has a rotatable shaft the axis of which is substantially parallel to the path of transport of the element and perpendicular to the direction of motion of the reciprocable first portion of the hopper, and wherein the actuator is connected to each of the reciprocable first portion of the hopper and to the reciprocable second portion of the hopper.

38. The apparatus of claim 31 wherein the actuator has a rotatable shaft the axis of which is substantially parallel to the path of transport of the element and perpendicular to the direction of motion of the reciprocable portion of the hopper, and wherein the actuator is connected to each of the reciprocable portion of the hopper and to the counterweight.

39. The apparatus of claim 25 wherein the actuator has a rotatable shaft the axis of which is substantially parallel to the path of transport of the element and perpendicular to the direction of motion of the reciprocable portion of the hopper, and wherein the actuator is connected to each of the reciprocable portion of the hopper and to the counterweight.

40. The apparatus of claim 38 wherein the actuator is disposed centrally above the hopper.

41. The apparatus of claim 37 wherein the actuator is disposed centrally above the hopper.

42. The apparatus of claim 36 wherein the actuator is disposed at one side of the hopper.

43. The apparatus of claim 38 wherein the actuator is disposed at one side of the hopper.

44. The apparatus of claim 37 wherein the actuator is disposed at one side of the hopper.

45. The apparatus of claim 36 wherein the actuator is disposed at one side of the hopper.

* * * * *